(12) United States Patent
Chiu et al.

(10) Patent No.: US 10,074,621 B2
(45) Date of Patent: Sep. 11, 2018

(54) ELECTRONIC PACKAGE WITH ANTENNA STRUCTURE

(71) Applicant: Siliconware Precision Industries Co., Ltd., Taichung (TW)

(72) Inventors: Chih-Hsien Chiu, Taichung (TW); Chi-Pin Tsai, Taichung (TW); Chi-Liang Shih, Taichung (TW); Ming-Fan Tsai, Taichung (TW); Chia-Yang Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/181,489

(22) Filed: Jun. 14, 2016

(65) Prior Publication Data

US 2017/0278807 A1    Sep. 28, 2017

(30) Foreign Application Priority Data

Mar. 28, 2016    (TW) ............................. 105109663 A (51) Int. Cl.
| | |
|---|---|
| *H01L 23/48* | (2006.01) |
| *H01L 23/66* | (2006.01) |
| *H01L 23/31* | (2006.01) |
| *H01L 23/498* | (2006.01) |
| *H01L 23/00* | (2006.01) |

(52) U.S. Cl.
CPC .......... *H01L 23/66* (2013.01); *H01L 23/3121* (2013.01); *H01L 23/49838* (2013.01); *H01L 24/49* (2013.01); *H01L 2223/6611* (2013.01); *H01L 2223/6677* (2013.01); *H01L 2224/16225* (2013.01); *H01L 2224/16227* (2013.01); *H01L 2224/48091* (2013.01); *H01L 2224/48101* (2013.01); *H01L 2224/48106* (2013.01); *H01L 2224/48195* (2013.01); *H01L 2224/48225* (2013.01); *H01L 2224/48227* (2013.01); *H01L 2224/48265* (2013.01); *H01L 2224/49171* (2013.01); *H01L 2224/73253* (2013.01); *H01L 2924/15192* (2013.01); *H01L 2924/19041* (2013.01); *H01L 2924/19042* (2013.01); *H01L 2924/19043* (2013.01); *H01L 2924/19105* (2013.01); *H01L 2924/19107* (2013.01)

(58) Field of Classification Search
None
See application file for complete search history.

(56) References Cited

U.S. PATENT DOCUMENTS

2006/0214798 A1*  9/2006  Wang ................. G06K 19/0723
                                                    340/572.7
2014/0325150 A1* 10/2014  Hashimoto ........... H01L 23/552
                                                    711/115

* cited by examiner

*Primary Examiner* — Cory Eskridge
(74) *Attorney, Agent, or Firm* — Mintz Levin Cohn Ferris Glovsky and Popeo, P.C.; Peter F. Corless; Steven M. Jensen (57) ABSTRACT

Provided is an electronic package, including: a carrier, an electronic component disposed on the carrier, and an antenna structure, wherein the antenna structure has a plurality of spacing members and at least one wire connected among the spacing members. No additional layout area is required to be formed on a surface of the carrier, such that the objective of miniaturization can be achieved.

10 Claims, 8 Drawing Sheets

ELECTRONIC PACKAGE WITH ANTENNA STRUCTURE

CROSS-REFERENCE TO RELATED APPLICATION

This application claims under 35 U.S.C. § 119(a) the benefit of Taiwanese Patent Application No. 105109663, filed Mar. 28, 2016, the entire contents of which are incorporated herein by reference.

BACKGROUND

1. Technical Field

The present disclosure relates to electronic packages, and, more particularly, to an electronic package with an antenna structure.

2. Description of Related Art

With the rapid development of the electronics industry, the current wireless communication technology has been widely used in a variety of consumer electronics products in order to facilitate the reception or transmission of a variety of wireless signals. In order to meet the aesthetic needs of consumer electronics products, the manufacture and design of wireless communication modules are focusing on lighter, thinner, shorter, and smaller modules. A patch antenna has been used in a wide range of mobile phones, personal digital assistants (PDAs) and other electronic products due to its small size, light weight, ease of manufacturing and other characteristics.

Figure 1:
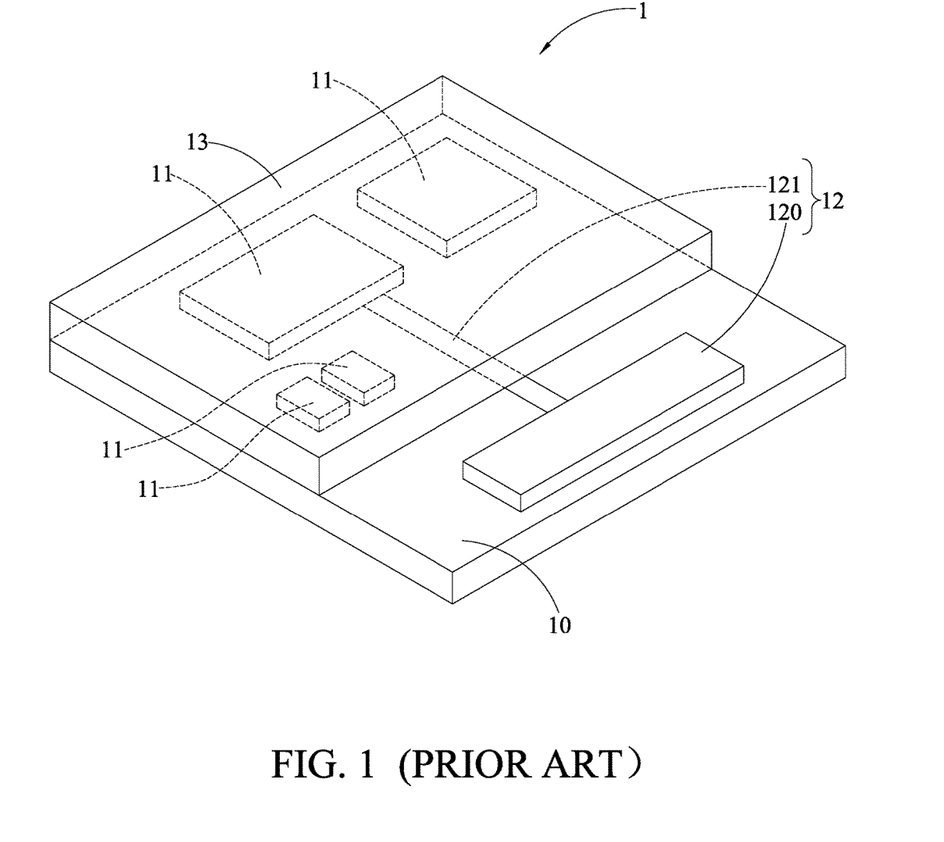
FIG. 1 is an isometric diagram depicting a traditional wireless communication module.

FIG. 1 is an isometric diagram depicting a traditional wireless communication module 1. The wireless communication module 1 includes: a packaging carrier 10, a plurality of electronic components 11, an antenna structure 12 and a molding compound 13. In an embodiment, the packaging carrier 10 is a rectangular circuit board. The electronic components 11 are disposed on the packaging carrier 10 and electrically connected with the packaging carrier 10. The antenna structure 12 is a patch antenna including an antenna body 120 and a conductive trace 121. The antenna body 120 is electrically connected with one of the electronic components 11 via the conductive trace 121. The molding compound 13 covers the electronic components 11 and a portion of the conductive trace 121.

In the wireless communication module 1, since the antenna structure 12 is flat, an additional layout area is needed to be formed on the surface of the packaging carrier 10 (an area that is not formed with the molding compound 13) for the conductive trace 121 to be formed therewithin. Thus, it is difficult to reduce the width of the packaging carrier 10 and the width of the wireless communication module 1, failing to satisfy the need for miniaturization of the wireless communication module 1.

Therefore, there is a need for a solution that addresses the aforementioned issues in the prior art.

SUMMARY

In view of the aforementioned shortcomings of the prior art, the present disclosure discloses an electronic package, which may include: a carrier; at least one electronic component disposed on the carrier; and at least one antenna structure disposed on the carrier and including a plurality of spacing members and at least one wire connected with two adjacent ones of the spacing members.

In an embodiment, the spacing members are electrically connected with the electronic component through another wire.

The present disclosure also discloses an electronic package, which may include: a carrier; at least one electronic component disposed on the carrier; and at least one antenna structure disposed on the carrier and including at least one spacing member and at least one wire connected with the electronic component and the spacing member.

In an embodiment, the electronic component is electrically connected with the carrier.

In an embodiment, the spacing member includes at least one conductive pad connected with the wire.

In an embodiment, the spacing member is disposed on and connected with the carrier.

In an embodiment, the spacing member includes at least one conductive pillar electrically connected with the carrier.

In an embodiment, the spacing member is electrically connected with the carrier through another wire.

In an embodiment, a passive element is disposed on the carrier. For example, the passive element is electrically connected with the spacing member or the electronic component through another wire.

In another embodiment, the spacing member is disposed on and connected with the electronic component.

In an embodiment, an encapsulating layer is further formed on the carrier and encapsulating the electronic component and the antenna structure. In another embodiment, the encapsulating layer completely encapsulates the antenna structure. In yet another embodiment, the spacing member is exposed from the encapsulating layer.

In the electronic package according to the present disclosure, the wire is formed on top of the carrier by wire bonding, such that the antenna structure becomes a stacked antenna. As a result, there is no need for an extra layout area on the surface of the carrier. Compared to the prior art, the width of the carrier of the present disclosure is shorter; therefore, the width of the electronic package can be reduced, enabling the electronic package to achieve the objective of miniaturization.

BRIEF DESCRIPTION OF THE DRAWINGS

The present disclosure can be more fully understood by reading the following detailed description of the embodiments, with reference made to the accompanying drawings, wherein:

FIG. 2A' is a cross-sectional diagram depicting another implementation of FIG. 2A;

FIG. 2A" is an isometric diagram depicting yet another implementation of FIG. 2A;

FIGS. 2B' and 2B" are partial isometric diagrams of other different implementations of FIG. 2A;

FIGS. 3A' and 3A" are cross-sectional diagrams of other different implementations of FIG. 3A;

FIG. 4A' is a cross-sectional diagram of another implementation of FIG. 4A;

DETAILED DESCRIPTION

The present disclosure is described by the following specific embodiments. Those with ordinary skills in the arts can readily understand other advantages and functions of the present disclosure after reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "up", "down", "bottom", "first", "second", "a" and the like, are for illustrative purposes only, and are not meant to limit the range implementable by the present disclosure. Any changes or adjustments made to their relative relationships, without modifying the substantial technical contents, are also to be construed as within the range implementable by the present disclosure.

Figure 2A:
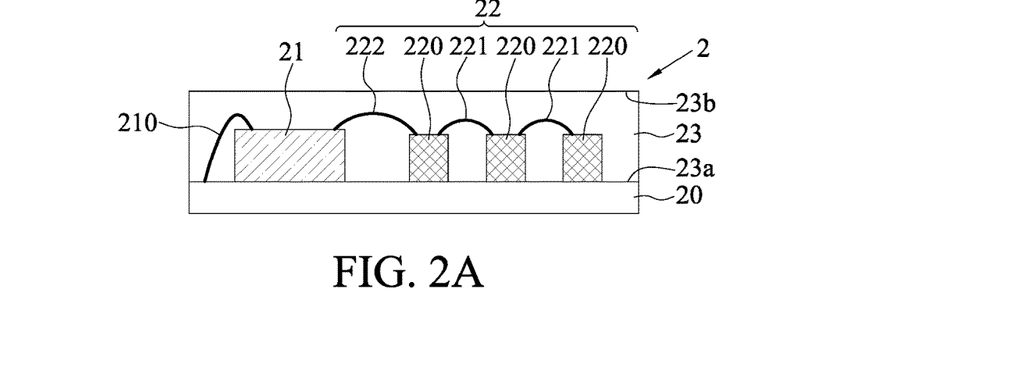
FIG. 2A is a cross-sectional diagram depicting an electronic package in accordance with a first embodiment of the present disclosure.
Figure 2B:
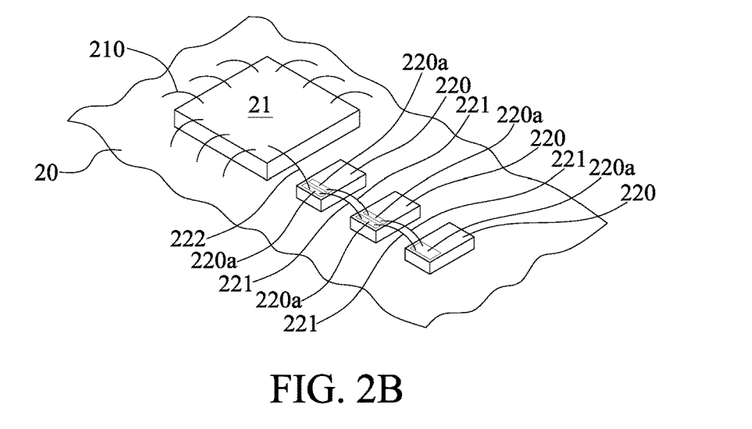
FIG. 2B is a partial isometric diagram of FIG. 2A with the encapsulating layer omitted.

FIGS. 2A, 2A', 2A", 2B, 2B' and 2B" are schematic diagrams illustrating electronic packages 2, 2' and 2" in accordance with a first embodiment of the present disclosure.

As shown in FIG. 2A, 2A', 2A", 2B, 2B' or 2B", the electronic package 2, 2' or 2" includes at least one carrier 20, at least one electronic component 21 or 21' disposed on the carrier 20, and at least one antenna structure 22 or 22' disposed on the carrier 20.

In an embodiment, the electronic package 2, 2' or 2" is a System-in-Package (SiP) wireless communication module.

The carrier 20 is a circuit board or a ceramic plate, and includes a wiring layer (not shown). It should be understood that there are numerous types of carriers, and the present disclosure is not limited as such.

The electronic component 21 or 21' may be an active element, a passive element, a packaging element or a combination thereof. In an embodiment, the active element may be, for example, a semiconductor chip; the passive element may be, for example, a resistor, a capacitor or an inductor; and the packaging element may include a chip and a molding compound encapsulating the chip.

In an embodiment, the electronic component 21 or 21' is an active element. As shown in FIGS. 2A and 2B, the electronic component 21 is electrically connected to the wiring layer of the carrier 20 via a plurality of wires 210 by wire bonding. Alternatively, as shown in FIG. 2A', the electronic component 21' is electrically connected to the wiring layer of the carrier 20 via a plurality of conductive bumps 210' in a flip-chip method.

The antenna structure 22 or 22' includes a plurality of spacing members 220 or 220' disposed on the carrier 20 and at least one wire 221. The wire 221 is connected among the spacing members 220 by wire bonding.

In an embodiment, the spacing member 220 or 220' may be a component having at least one conductive pad 220a (as shown in FIGS. 2B, 2B' and 2B"). In an embodiment, the component may be a chip, a carrier, a ceramic plate, ferrite, a packaging element, an electronic component, an interposer, or other electronic component. The wires 221 connect the conductive pads 220a of the spacing members 220 or 220'.

Moreover, as shown in FIGS. 2A and 2B, a spacing member 220 is electrically connected to the electronic component 21 via at least one wire 222 on the conductive pad 220a by wire bonding. Alternatively, as shown in FIG. 2A', at least one spacing member 220' includes at least one penetrating conductive pillar 222', and the top end and the bottom end of the conductive pillar 222' are electrically connected with the wire 221 and the carrier 20, respectively.

Further, as shown in FIGS. 2B and 2B', the wires 221 and 222 and the conductive pad 220a can have their layouts adjusted according to needs. As shown in FIG. 2B", the quantity of the spacing member 220, 220' and 220" can be adjusted according to needs.

In addition, the electronic package 2, 2' or 2" may selectively include an encapsulating layer 23, as shown in FIG. 2A, 2A' or 2A". The encapsulating layer 23 is formed on the carrier 20, and encapsulates the electronic component 21 or 21' and the antenna structure 22 or 22'. The encapsulating layer 23 includes a first surface 23a and a second surface 23b opposite to the first surface 23a, and combines with the carrier 20 through the first surface 23a.

In an embodiment, the encapsulating layer 23 is made of an insulating material, such as polyimide (PI), a dry film, epoxy resin or a molding compound.

In an embodiment, the encapsulating layer 23 may completely encapsulate the antenna structure 22 or 22'. Alternatively, as shown in the electronic package 2" of FIG. 2A", the spacing member 220 may be selectively exposed from a side face 23a of the encapsulating layer 23, wherein the side face 23c is adjacent to the first surface 23a and the second surface 23b.

Figure 3A:
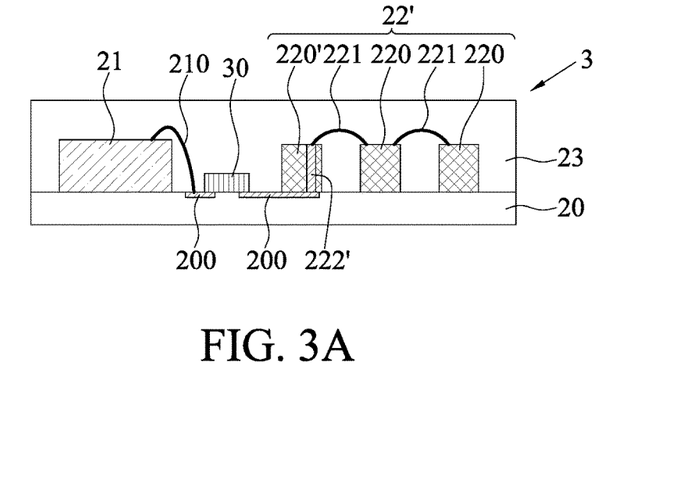
FIG. 3A is a cross-sectional diagram depicting an electronic package in accordance with a second embodiment of the present disclosure.
Figure 3B:
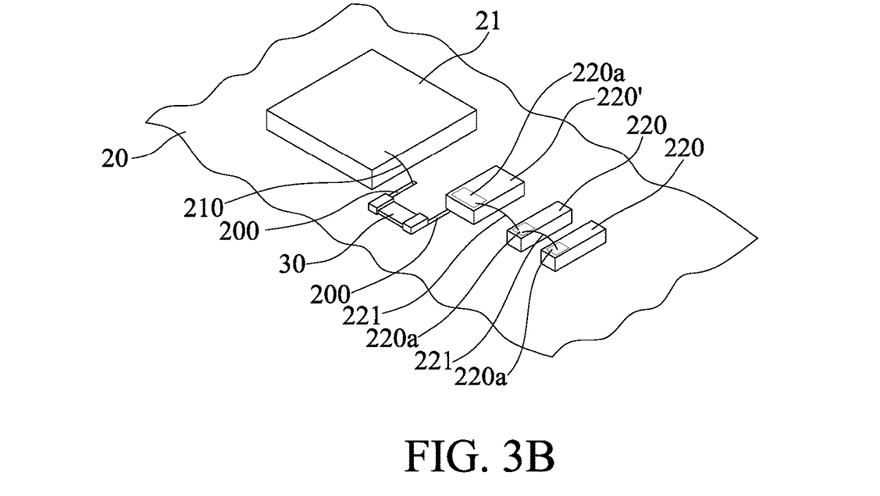
FIG. 3B is a partial isometric diagram of FIG. 3A with the encapsulating layer omitted.

FIGS. 3A, 3A', 3A" and 3B are schematic diagrams illustrating electronic packages 3, 3' and 3" in accordance with a second embodiment of the present disclosure. The second embodiment differs from the first embodiment in that the second embodiment further includes at least one passive element 30. Thus, only differences are described below, while the descriptions of similar or the same elements/components are omitted.

As shown in FIGS. 3A, 3A', 3A" and 3B, at least one passive element 30 is disposed on the carrier 20.

In an embodiment, as shown in FIGS. 3A and 3B, the electronic component 21 is electrically connected to the wiring layer 200 of the carrier 20 via at least one wire 210 by wire bonding, and the conductive pillar 222' of at least one spacing member 220' of the antenna structure 22' is electrically connected with the passive element 30 via the wiring layer 200 of the carrier 20.

In an embodiment, as shown in FIG. 3A', the electronic component 21 is electrically connected to the wiring layer 200 of the carrier 20 via at least one wire 210 by wire bonding, at least one spacing member 220 of an antenna structure 32 is electrically connected with the wiring layer 200 of the carrier 20 via a wire 322 by wire bonding, and the passive element 30 is electrically connected to the wiring layer 200 of the carrier 20.

In an embodiment, as shown in FIG. 3A'', the electronic component 21 is electrically connected to the passive element 30 by wire bonding, at least one spacing member 220 of the antenna structure 32 is electrically connected with the passive element 30 via the wire 322 by wire bonding, and the passive element 30 is electrically connected to the wiring layer 200 of the carrier 20.

Figure 4A:
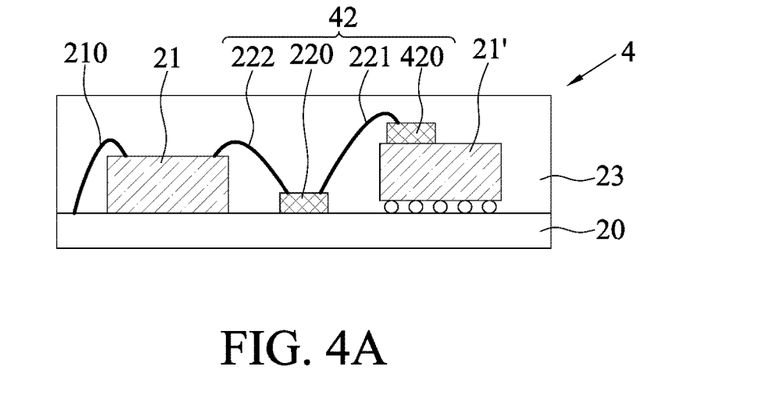
FIG. 4A is a cross-sectional diagram depicting an electronic package in accordance with a third embodiment of the present disclosure.
Figure 4B:
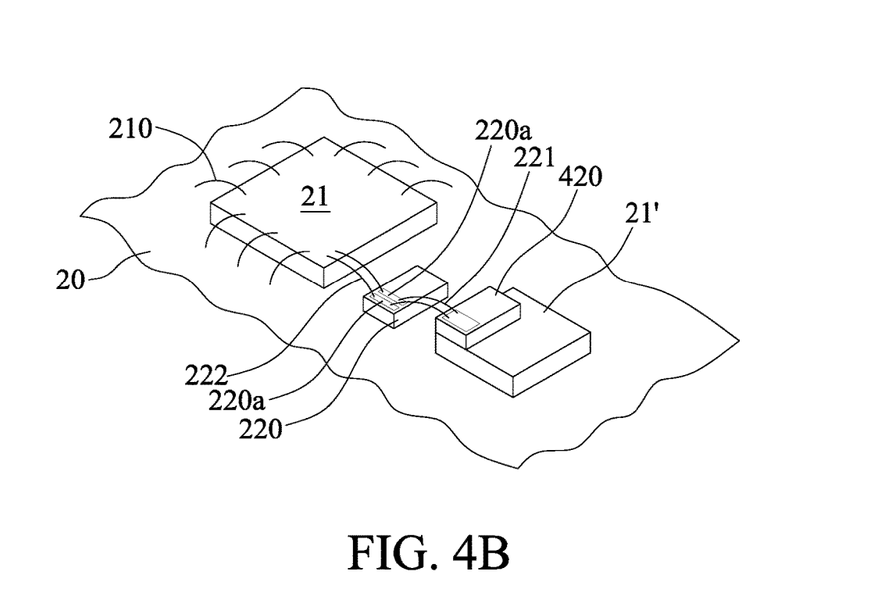
FIG. 4B is a partial isometric diagram of FIG. 4A with the encapsulating layer omitted.

FIGS. 4A, 4A', 4B and 4B' are schematic diagrams illustrating electronic packages 4 and 4' in accordance with a third embodiment of the present disclosure. The third embodiment differs from the first and second embodiments in the position of a spacing member 420. Thus, only differences are described below, while the descriptions of similar or the same elements/components are omitted.

As shown in FIGS. 4A, 4A', 4B and 4B', the spacing member 420 is disposed on the electronic component 21' or 41.

In an embodiment, as shown in FIGS. 4A and 4B, the electronic package 4 includes a plurality of electronic components 21 and 21', and a spacing member 420 of an antenna structure 42 is disposed on one of the electronic components 21'.

In an embodiment, as shown in FIGS. 4A' and 4B', the electronic package 4' includes a plurality of electronic components 41 and 21' and the passive element 30. The electronic component 41 is a packaging element, a spacing member 420 of an antenna structure 42' is disposed on each of the electronic components 41 and 21', and the spacing member 420 and the electronic component 41 are electrically connected to the wiring layer 200 of the carrier 20 and the passive element 30 through wiring bonding (via the wire 322 and the wire 210).

Figure 5A:
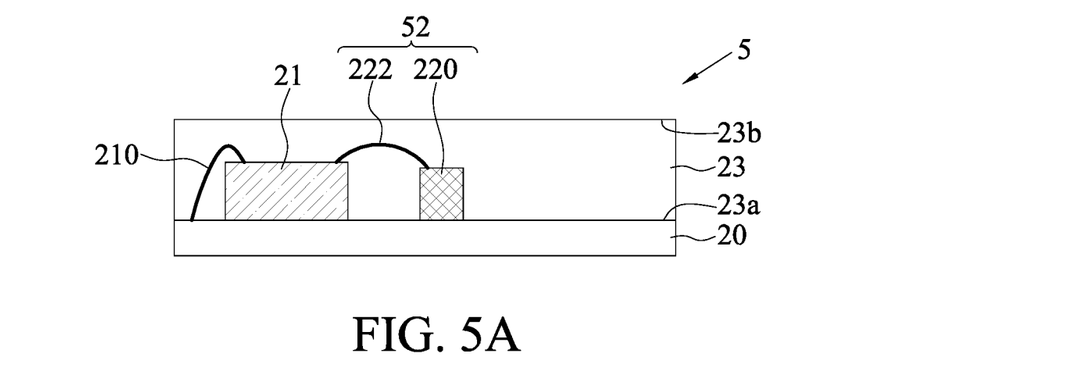
FIGS. 5A and 5B are cross-sectional diagrams depicting an electronic package in accordance with a fourth embodiment of the present disclosure.
Figure 5B:
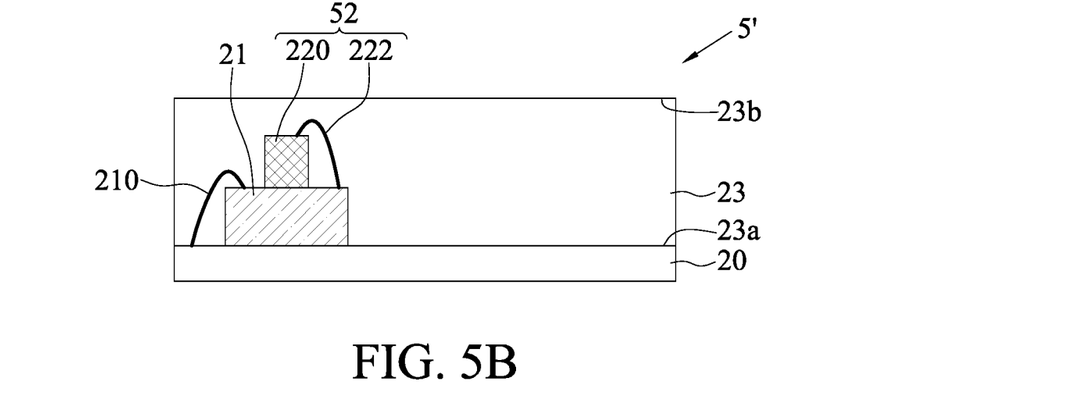

FIGS. 5A and 5B are cross-sectional diagrams illustrating the electronic package in accordance with a fourth embodiment of the present disclosure. The fourth embodiment differs from the first embodiment in the layout of the wires. Thus, only differences are described below, while the descriptions of similar or the same elements/components are omitted.

As shown in FIG. 5A, an antenna structure 52 of an electronic package 5 includes at least one spacing member 220 and at least one wire 222, and the spacing member 220 is electrically connected to the electronic component 21 via the at least one wire 222 through wire bonding. Thus, the spacing member 220 is not electrically connected with one another by wire bonding. It should be understood that, as shown in FIG. 5B, the spacing member 220 of the electronic package 5' can be disposed on the electronic component 21.

In other embodiments, the electronic package may include a plurality of antenna structures.

In the electronic package 2, 2', 2'', 3, 3', 3'', 4, 4', 5 or 5' according to the present disclosure, the wire 221, 222 or 322 is formed by wire bonding to replace the traditional conductive trace, such that during the manufacturing process, the antenna structure 22, 22', 32, 42 or 52 can be integrally made with the electronic component 21, 21' or 41. In other words, they can be packaged at the same time, such that the encapsulating layer 23 can encapsulate the electronic component 21, 21' or 41 as well as the antenna structure 22, 22', 32, 42 or 52. This allows the mould used for the packaging process to correspond to the size of the carrier 20, thereby facilitating the packaging process.

Moreover, the wire 221, 222 or 322 is disposed on top of the carrier 20, such that the antenna structure 22, 22', 32, 42 or 52 becomes a stacked antenna. As a result, the antenna structure 22, 22', 32, 42 or 52 can be laid out within the same area as the electronic component 21 or 21' (i.e., the area for forming the encapsulating layer 23), such that there is no need for an extra layout area on the surface of the carrier 20. Compared with the prior art, the carrier 20 according to the present disclosure is narrower. Therefore, the width of the electronic package 2, 2', 2'', 3, 3', 3'', 4, 4', 5 or 5' can be reduced, enabling the electronic package 2, 2', 2'', 3, 3', 3'', 4, 4', 5 or 5' to achieve the objective of miniaturization.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:

1. An electronic package, comprising:
   a carrier;
   at least one electronic component disposed on the carrier;
   at least one antenna structure disposed on the carrier and consisting of a plurality of spacing members and at least one wire, wherein the wire connects any two adjacent ones of the spacing members, and each of the spacing members has at least one conductive pad connected with the wire; and
   an encapsulating layer formed on the carrier and encapsulating the electronic component and a portion of the antenna structure, wherein at least one of the spacing members is exposed from the encapsulating layer.

2. The electronic package of claim 1, wherein the electronic component is electrically connected with the carrier.

3. The electronic package of claim 1, wherein one of the spacing members is disposed on the carrier.

4. The electronic package of claim 1, wherein one of the spacing members is electrically connected with the electronic component through another wire.

5. The electronic package of claim 1, wherein one of the spacing members includes at least one conductive pillar electrically connected with the carrier.

6. The electronic package of claim 1, wherein one of the spacing members is electrically connected with the carrier through another wire.

7. The electronic package of claim 1, further comprising a passive element disposed on the carrier.

8. The electronic package of claim 7, wherein the passive element is electrically connected with one of the spacing members through another wire.

9. The electronic package of claim 7, wherein the passive element is electrically connected with the electronic component through another wire.

10. The electronic package of claim 1, wherein one of the spacing members is disposed on the electronic component.

* * * * *